United States Patent
Li

(10) Patent No.: US 9,240,421 B2
(45) Date of Patent: Jan. 19, 2016

(54) DISPLAY PANEL, METHOD FOR FABRICATING THE SAME AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Fan Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/366,908

(22) PCT Filed: Nov. 27, 2013

(86) PCT No.: PCT/CN2013/087972
§ 371 (c)(1),
(2) Date: Jun. 19, 2014

(87) PCT Pub. No.: WO2015/003453
PCT Pub. Date: Jan. 15, 2015

(65) Prior Publication Data
US 2015/0028343 A1 Jan. 29, 2015

(30) Foreign Application Priority Data
Jul. 11, 2013 (CN) .......................... 2013 1 0291727

(51) Int. Cl.
*H01L 27/12* (2006.01)
*H01L 21/768* (2006.01)
(Continued)

(52) U.S. Cl.
CPC ................ *H01L 27/124* (2013.01); *G02B 5/20* (2013.01); *H01L 21/76805* (2013.01);
(Continued)

(58) Field of Classification Search
CPC .............. H01L 27/124; H01L 27/1259; H01L 21/76805; H01L 29/456; H01L 29/4908; H01L 29/66765; H01L 51/5215; H01L 27/322; G02F 1/1345; G02F 1/136227
USPC ............ 257/59, 72, 79, 81, E27.111; 438/48, 438/149, 128, 158, 704
See application file for complete search history.

(56) References Cited

U.S. PATENT DOCUMENTS

| | | | |
|---|---|---|---|
| 6,943,367 B2 * | 9/2005 | Kim et al. ........................ 257/25 |
| 2012/0133612 A1 | 5/2012 | Wang et al. | |

FOREIGN PATENT DOCUMENTS

| | | |
|---|---|---|
| CN | 1693974 A | 11/2005 |
| CN | 102650770 A | 8/2012 |

(Continued)

OTHER PUBLICATIONS

Written Opinion of the International Searching Authority Dated Apr. 22, 2014; PCT/CN2013/087972.

*Primary Examiner* — Thinh T Nguyen
(74) *Attorney, Agent, or Firm* — Ladas & Parry LLP

(57) ABSTRACT

A display panel is discloses. A gate line and a gate connection line of an array substrate are disposed perpendicular to each other. A passivation layer is formed on a side of a source electrode or a drain electrode of the array substrate which is close to the color filter substrate. A first via hole is disposed in the passivation layer. A color filter substrate includes a first substrate, and a data line parallel to the gate connection line is formed on a side of the first substrate which is close to the array substrate. A protection layer, a black matrix and a common electrode are sequentially formed on a side of the data line which is close to the array substrate. A second via hole is disposed in a region of the protection layer, the black matrix and the common electrode which corresponds to the data line. A first end of a conductive spacer is connected to the source electrode or the drain electrode by way of the first via hole, a second end of the conductive spacer is connected to the data line by way of the second via hole. A method for fabricating a display panel and a display device are further disclosed.

20 Claims, 8 Drawing Sheets

(51) Int. Cl.
*G02B 5/20* (2006.01)
*H01L 29/45* (2006.01)
*H01L 51/52* (2006.01)
*H01L 27/32* (2006.01)
*H01L 29/49* (2006.01)
*G02F 1/1345* (2006.01)

(52) U.S. Cl.
CPC ........... *H01L 27/1259* (2013.01); *G02B 5/201* (2013.01); *G02F 1/1345* (2013.01); *H01L 27/3276* (2013.01); *H01L 29/456* (2013.01); *H01L 29/4908* (2013.01); *H01L 51/5215* (2013.01)

(56) References Cited

FOREIGN PATENT DOCUMENTS

| | | |
|---|---|---|
| CN | 102707470 A | 10/2012 |
| CN | 102981337 A | 3/2013 |
| KR | 20080076459 A | 8/2008 |

\* cited by examiner

US 9,240,421 B2

DISPLAY PANEL, METHOD FOR FABRICATING THE SAME AND DISPLAY DEVICE

FIELD OF THE ART

Embodiments of the invention relate to the display field, more particularly, to a display panel, a method for fabricating the same and a display device.

BACKGROUND

In a traditional display, connection terminals that connect the gate line and the gate driving circuit are disposed on the peripheral of the active display region, which leads to a wide frame of the display, thereby reducing the visual effect of the whole display. The wider the frame is, the worse the visual effect is. To solve the above problem, a known array substrate in which the gate connection line is L-shaped is proposed. A part of the gate connection line and the data line are disposed as overlapping with and parallel to each other, and the gate connection line and the data line are separated by the gate insulating layer. Similar to connection terminals of the data line and the data line driving circuit, the connection terminals of the gate connection line and the gate driving circuit are positioned in a region of the active display region which corresponds to the black matrix, thereby avoiding reserving a wider frame for the gate connection line and reducing the width of the display frame.

However, the technical solution brings another problem, that is, parts of the gate connection line and the data line disposed on the array substrate are disposed parallel each other, though there is the insulating layer therebetween, the close distance makes the cross-talk between the gate connection line and the data line serious, thereby degrading the image display quality of the display.

SUMMARY

Embodiments of the invention provide a display panel, a method for fabricating the same and a display device, which improve the display effect of the display panel and the display device while reducing width of the frame.

A first aspect of the invention provides a display panel, comprising an array substrate and a color filter substrate;

a gate line and a gate connection line of the array substrate are disposed orthogonal to each other;

a passivation layer is formed on a side of a source electrode or a drain electrode of the array substrate which is close to the color filter substrate, a first via hole is disposed in a region of the passivation layer which corresponds to the source electrode or the drain electrode;

the color filter substrate comprises a first substrate; a data line parallel to the gate connection line is formed on a side of the first substrate which is close to the array substrate; a protection layer, a black matrix and a common electrode are sequentially formed on a side of the data line which is close to the array substrate; a second via hole is disposed in a region of the protection layer, the black matrix and the common electrode which corresponds to the data line; a conductive spacer is disposed in the second via hole, wherein a first end of the conductive spacer is connected to the source electrode or the drain electrode by way of the first via hole, a second end of the conductive spacer is connected to the data line by way of the second via hole, and the conductive spacer is insulated from the common electrode.

A second aspect of the invention further provides a display device; the display device comprises the above display panel.

A third aspect of the invention further provides a method for fabricating a display panel, the method comprises:

forming a pattern of a data line on a first substrate;

forming a protection layer on the data line, and forming a pattern of a second sub-via hole in a region of the protection layer which corresponding to the data line;

sequentially forming patterns of a black matrix and a common electrode on the protection layer, and forming a pattern of a second via hole in the black matrix and the common electrode at a location corresponding to the second sub-via hole;

forming a pattern of a conductive spacer in the second via hole, wherein a second end of the conductive spacer is connected to the data line by way of the second via hole, and the conductive spacer and the common electrode are disposed as insulating from each other, thereby forming a color filter substrate;

forming an array substrate, wherein a gate electrode and a gate connection line of the array substrate being disposed orthogonal to each other, a first via hole is formed in a passivation layer of the array substrate in a region corresponding to a source electrode or a drain electrode;

assembling the color filter substrate and the array substrate to form a cell, wherein a first end of the conductive spacer is connected to the source electrode or the drain electrode by way of the first via hole, and the gate connection line is disposed parallel to the data line.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

111-first substrate; 112-data line; 112a-protrusion; 113-protection layer; 114-black matrix; 115-color filter; 116-common electrode; 117-conductive spacer; 117a-first via hole; 117b-second via hole; 117c-second sub-via hole; 121-second substrate; 122-gate line; 123-gate insulation layer; 124-active layer; 125-source electrode; 126-drain electrode;

127-gate connection line; 127a,127a'-third via hole; 128-passivation layer; 129-pixel electrode; 129a-fourth via hole.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiment 1

Figure 1:
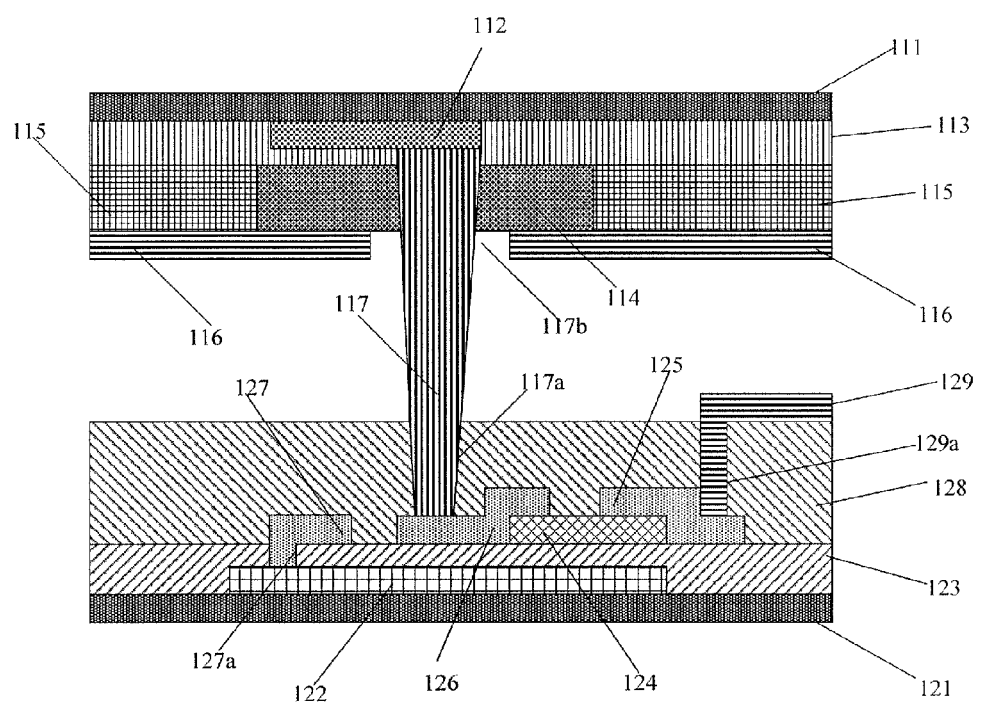
FIG. 1 schematically illustrates a cross section view of a display panel in accordance with Embodiment 1 of the invention.
Figure 2:
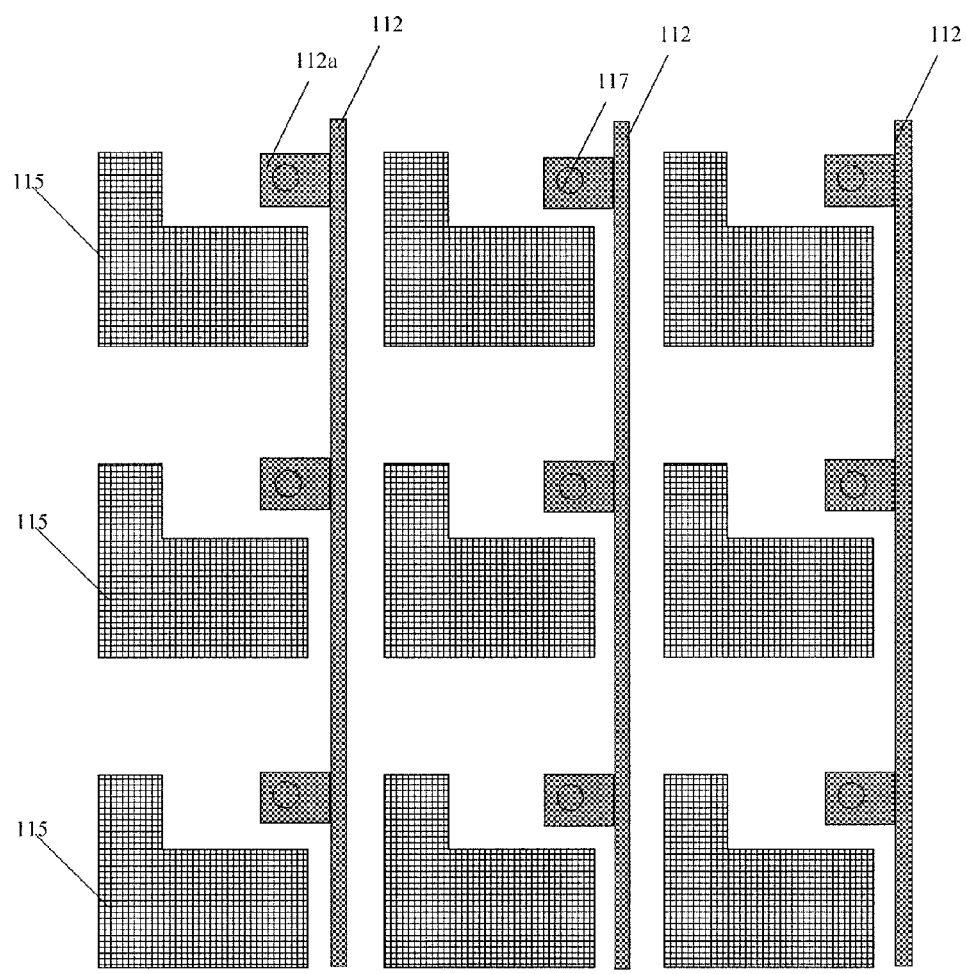
FIG. 2 schematically illustrates a plan view of a color filter substrate of the display panel in accordance with Embodiment 1 of the invention.
Figure 3:
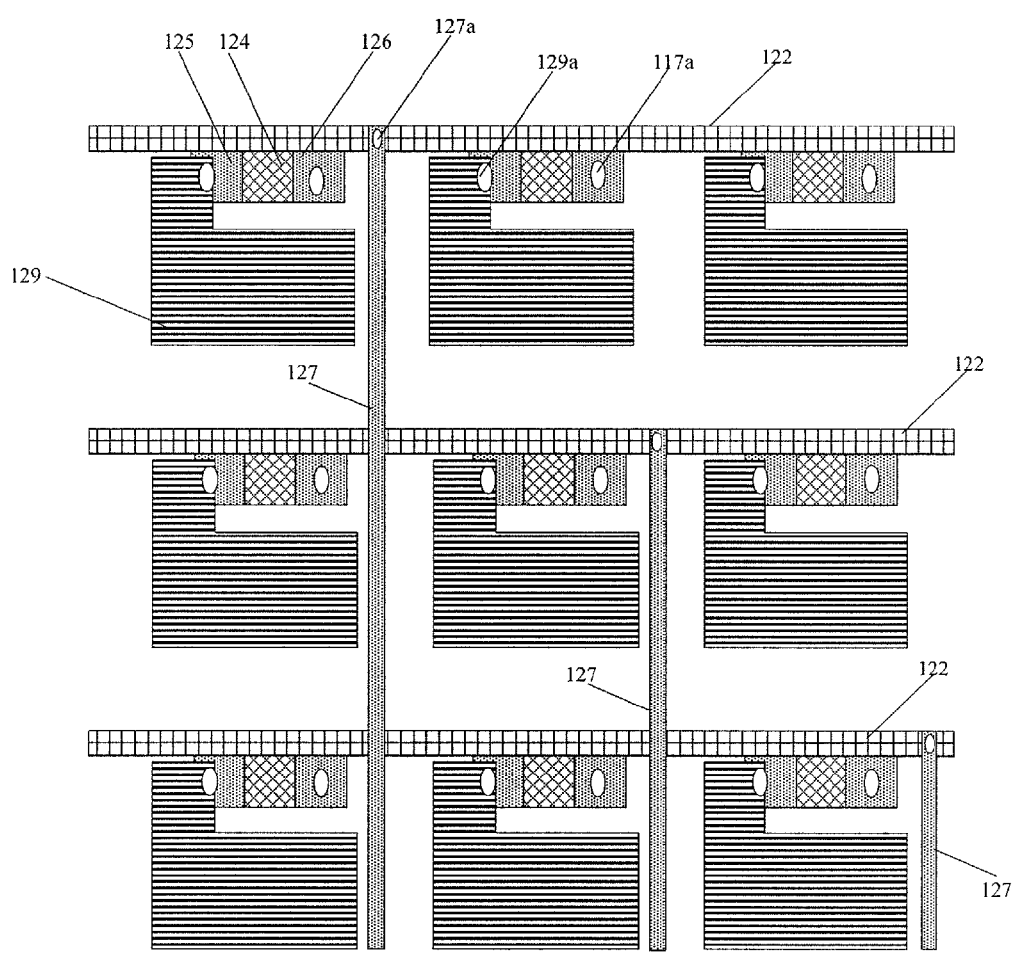
FIG. 3 schematically illustrates a plan view of an array substrate of the display panel in accordance with Embodiment 1 of the invention.

FIG. 1 is a cross section view of a display panel provided by Embodiment 1 of the invention. The display panel comprises a color filter substrate and an array substrate. FIG. 2 is a schematic plan view of the color filter substrate of the display panel of Embodiment 1 of the invention. FIG. 3 is a schematic plan view of the array substrate of the display panel of Embodiment 1 of the invention.

With reference to FIGS. 1 and 2, the color filter substrate comprises: a first substrate 111, a data line 112 formed on a side of the first substrate 111 which is close to the array substrate, a protection layer 113 formed on a side of the data line which is close to the array substrate, a black matrix 114 and a color filter 115 formed on a side of the protection layer 113 which is close to the array substrate, and a common electrode 116 formed on a side of the black matrix 114 and the color filter 115 which is close to the array substrate.

A second via hole 117b is formed in a region of the protection layer 113, the black matrix 114 and the common electrode 116 which corresponds to the data line 112. A second end of a conductive spacer 117 is connected to the data line 112 by way of the second via hole 117b, and an opening of the second via hole 117b in the common electrode 116 is larger than that in protection layer 113 and the black matrix 114, thereby allowing the conductive spacer 117 to be insulated from the common electrode 116.

As an example, a protrusion 112a (see FIG. 2) is formed on the data line 112; the protrusion 112a corresponds to a position of a drain electrode 126 on the array substrate and has the same shape as the drain electrode 126. The second end of the conductive spacer 117 is connected to the protrusion, thereby increasing the contacting area between the conductive spacer 117 and the data line 112, which enhances the stability of electric-conductivity.

In the embodiment, the data line 112 is formed in a projection region of the black matrix 114 on the first substrate 111, thereby preventing the data line 112 and the conductive spacer 117 from affecting the normal display of the display panel. Furthermore, in practical applications, the data line 112 may be partly disposed outside the projection region of the black matrix 114 on the color filter substrate, that is, it is disposed in the projection region of the color filter 115 on the first substrate 111. In this case, the second via hole 117b may partly penetrate the color filter 115. Though it may affect the display effect of the display panel to a certain extent, the influence is negligible and the normal display effect can be guaranteed.

With reference to FIGS. 1 and 3, the array substrate comprises: a second substrate 121, a gate line 122 formed on a side of the second substrate which is close to the color filter substrate, a gate insulating layer 123 formed on a side of the gate line 122 which is close to the color filter substrate, an active layer 124 and a gate connection line 127 formed on a side of the gate insulating layer 123 which is close to the color filter substrate, a source electrode 125 and a drain electrode 126 formed on a side of the active layer 124 which is close to the color filter substrate, a passivation layer 128 formed on a side of the gate connection line 127, the source electrode 125 and the drain electrode 126 which is close to the color filter substrate, and a pixel electrode 129 formed on a side of the passivation layer 128 which is close to the color filter substrate.

A third via hole 127a is formed in a region of the gate insulating layer 123 which corresponds to the gate line 122, and the gate connection line 127 is connected to the gate line 122 by way of the third via hole 127a. Each gate connection line 127 corresponds to one gate line 122. The gate connection line 127 is made of the same metal material as the source electrode 125 and the drain electrode 126, and the third via hole 127a is filled with the same metal material as the gate connection line 127, so as to connect the gate connection line 127 and the gate line 122. The gate connection line 127 and the gate line 122 are disposed orthogonal to each other, and the gate connection line 127 is disposed parallel to the data line 122.

Furthermore, in a known technology, the gate connection line is disposed directly on a side of the second substrate which is close to the color filter substrate, then a second insulating layer, the gate line and the gate insulating layer are disposed sequentially on a side of the gate connection line which is close to the color filter substrate, and a via hole connecting the gate connection line and the gate line is formed in the second insulating layer. In comparison with the above known technology, the gate connection line 127 in the embodiment is disposed on a side of the gate insulating layer 123 which is close to the color filter substrate, thereby omitting one patterning process and one insulating layer, which reduces the production cost and increases the production efficiency.

The first via hole 117a is disposed in a region of the passivation layer 128 which corresponds to the drain electrode 126, and a first end of the conductive spacer 117 is connected to the drain electrode 126 by way of the first via hole 117a, thereby transferring the data signal on the data line 112 to the drain electrode 126 via the conductive spacer 117. A fourth via hole 129a is disposed in a region of the passivation layer 128 which corresponds to the source electrode 125, and the pixel electrode 129 is connected to the source electrode 125 by way of the fourth via hole 129*a*. Locations of the source electrode 125 and the drain electrode 126 are not limited to that shown in the drawings, for example, their locations are exchangeable.

In the display panel of the embodiment, the gate connection line 127 is disposed in the display region, thereby reducing the width of the frame. Meanwhile, the data line 112 is disposed on the color filter substrate, and the data line 112 and the drain electrode 126 of the array substrate is connected to each other through the conductive spacer 117, thereby increasing the distance between the data line 112 and the gate connection line 127, thus, the cross-talk between the data line 112 and the gate connection line 127 is reduced. Therefore the display effect of the display panel and the display device is increased while the width of the frame is reduced.

Embodiment 2

Figure 4:
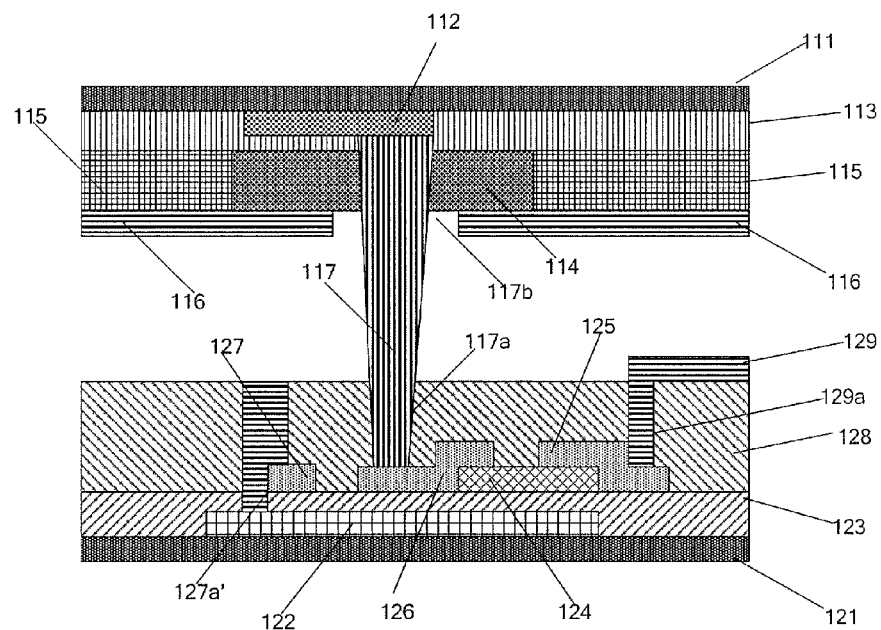
FIG. 4 schematically illustrates a cross section view of a display panel in accordance with Embodiment 2 of the invention.

FIG. 4 is a cross section view of a display panel in accordance with Embodiment 2 of the invention. The display panel of the embodiment is substantially the same as the display panel of Embodiment 1, except that the third via hole 127*a*' further penetrates through the passivation layer 128, and the third via hole 127*a*' is filled with the same metal material as the pixel electrode 129, so as to connect the gate line 122 and the gate connection line 127.

By using the configuration of the Embodiment 2, the third via hole 127*a*' penetrating through both the passivation layer 128 and the gate insulating layer 123 may be formed while forming the fourth via hole 129*a* in the passivation layer 128, thereby omitting the step of separately forming the third via hole in the gate insulating layer 123 and omitting one patterning process.

Embodiment 3

FIGS. 5*a*~5*h* schematically illustrate respective process steps of a method for fabricating a display panel in accordance with Embodiment 3 of the invention. As illustrated in FIGS. 5*a*~5*h*, the method comprises:

510: forming a pattern of a data line 112 on a first substrate 111.

Figure 5A:
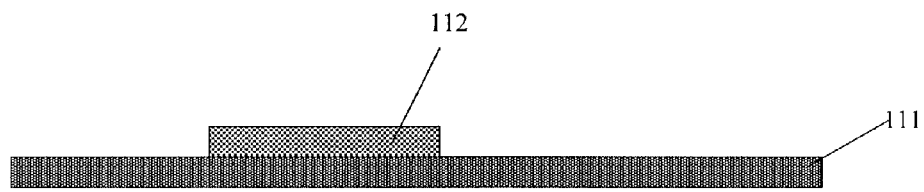
FIGS. 5a~5h schematically illustrate respective process steps of a method for fabricating a display panel in accordance with Embodiment 3 of the invention.

As illustrated in FIG. 5*a*, a data line metal film is formed on the first substrate 111, and the pattern of the data line 112 is formed through a patterning process. As an example, a pattern of a protrusion (not shown) is formed at the same time in a region of the data line metal film which corresponds to the drain electrode of the array substrate through the patterning process; a shape of the protrusion is the same as that of the drain electrode. Herein the patterning process generally comprises processes of photoresist application, exposing, developing, etching, photoresist peeling and the like.

520: forming a protection layer 113 on the data line 112, and forming a pattern of a second sub-via hole 117*c* in a region of the protection layer 113 which corresponding to the data line 112.

Figure 5B:
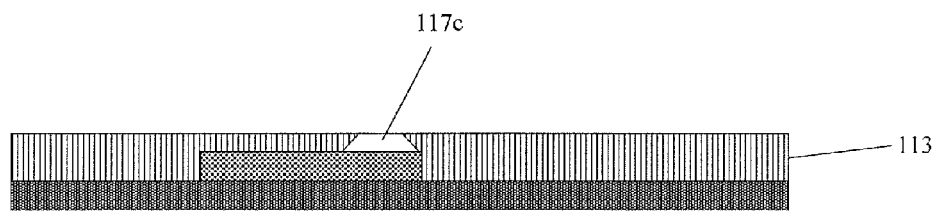

As illustrated in FIG. 5*b*, a protection layer film is formed on the data line 112, and the pattern of the second sub-via hole 117*c* is formed in a region of the protection layer film which corresponds to the data line through a patterning process. The second sub-via hole 117*c* is for example formed in a region corresponding to the protrusion.

530: sequentially forming patterns of a black matrix 114 and a common electrode 116 on the protection layer 113, and forming a pattern of a second via hole 117*b* in the black matrix 114 and the common electrode 116 at a location corresponding to the second sub-via hole 117*c*.

Figure 5C:
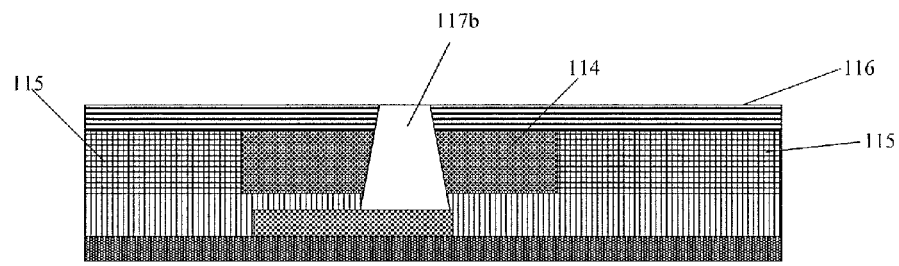

As illustrated in FIG. 5*c*, a pattern of a color filter 115 is further formed on the protection layer 113 in step 530. The color filter 115 may comprise a red color filter, a green color filter and a blue color filter, or a red color filter, a green color filter, a blue color filer and a white color filter. The embodiment is only described with reference to the scenario of comprising a red color filter, a green color filter and a blue color filter, though the method is also applicable to four-color display comprising a red color filter, a green color filter, a blue color filter and a white color filter, which will not be elaborated here. The black matrix 114, the red color filter, the green filter and the blue filter may be formed using a known patterning process, such as four patterning processes (i.e., the third to the sixth patterning processes in the method). After forming the black matrix 114, the red color filter, the green filter and the blue filter, a pattern of a common electrode 116 is formed on the black matrix 114 and the red, green and blue filters; then, a patterning process (i.e., the seventh patterning process) is used to form the pattern of the second via hole 117*b*. As an example, the second via hole in step 530 further penetrates through the color filter 115.

540: forming a pattern of a conductive spacer 117 in the second via hole 117*b*, a second end of the conductive spacer 117 is connected to the data line 112 by way of the second via hole 117*b*, and the conductive spacer 117 and the common electrode 116 are disposed as insulating from each other. The color filter substrate is formed up till now.

Figure 5D:
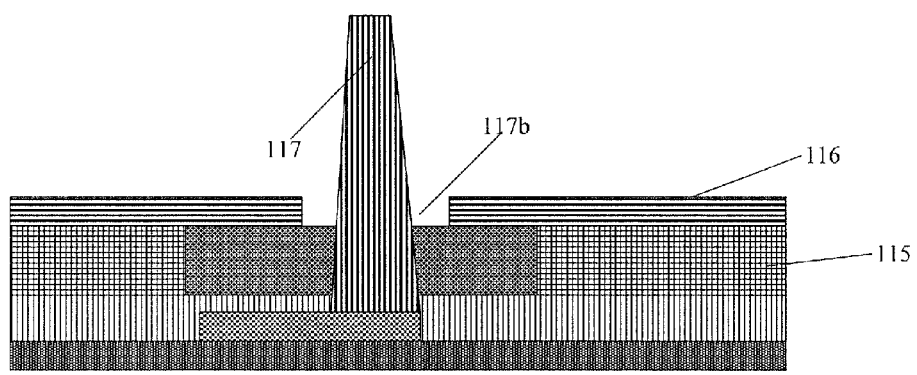

As illustrated in FIG. 5*d*, a conductive spacer metal material is formed on the common electrode 116, and an eighth patterning process is used to form the pattern of the conductive spacer 117, and an opening of the second via hole 117*b* in the common electrode 116 is enlarged through the eighth patterning process, making the common electrode 116 not contacting the conductive spacer 117, thereby guaranteeing that the conductive spacer 117 is insulated from the common electrode 116. The color filter substrate is formed up till now.

550: sequentially forming patterns of a gate line 122 and a gate insulating layer 123 on a second substrate 121, forming a pattern of a third via hole 127*a* in a region of the gate insulating layer 123 which corresponds to the gate line 122.

Figure 5E:
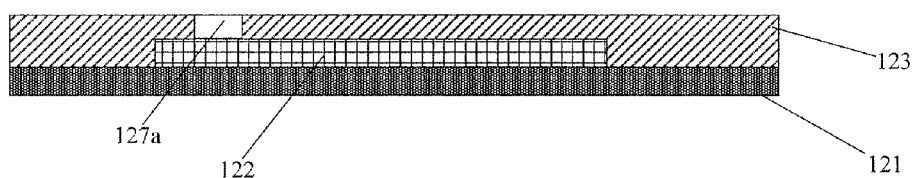

As illustrated in FIG. 5*e*, the pattern of the gate line 122 and the pattern of the gate insulating layer 123 may be formed on the second substrate 121 with a known technology. For example, the pattern of the gate line 122 is formed through a first patterning process; then, the pattern of the third via hole 127*a* may be formed in a region of the gate insulating layer 123 which corresponds to the gate line 122 through a second patterning process.

560: sequentially forming patterns of an active layer 124, a source 125 and a drain electrode 126 on the gate insulating layer 123, forming a pattern of a gate connection line 127 on the gate insulating layer 123; the gate connection line 127 is connected to the gate line 122 by way of the third via hole 127*a*, and the gate connection line 127 is perpendicular to the gate line 122.

Figure 5F:
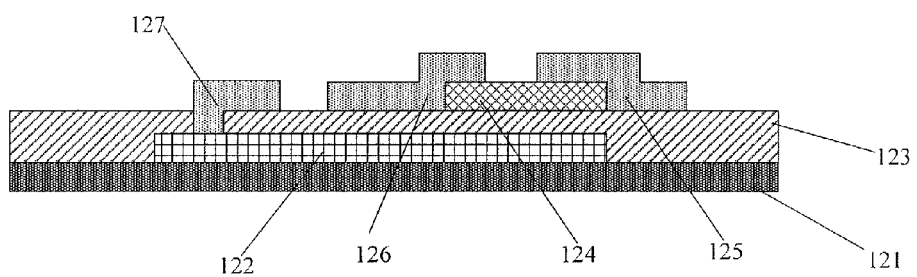

As illustrated in FIG. 5*f*, a pattern of the active layer 124 is formed on a region of the gate insulating layer 123 which corresponds to the gate line 122 through a third patterning process; and then patterns of the source electrode 125, the drain electrode 126 and the gate connection line 127 are formed through a fourth patterning process. That is to say, the gate connection line 127 and the source electrode 125, the drain electrode 136 are formed by etching the same metal material. Moreover, the third via hole 127*a* is filled with the same metal material as the gate connection line 127, so as to connect the gate line 122 and the gate connection line 127.

570: forming a passivation layer 128 on the source electrode 125, the drain electrode 126 and the gate connection line 127, forming a pattern of a first via hole 117*a* in a region of the passivation layer 128 which corresponds to the source electrode 125 or the drain electrode 126.

Figure 5G:
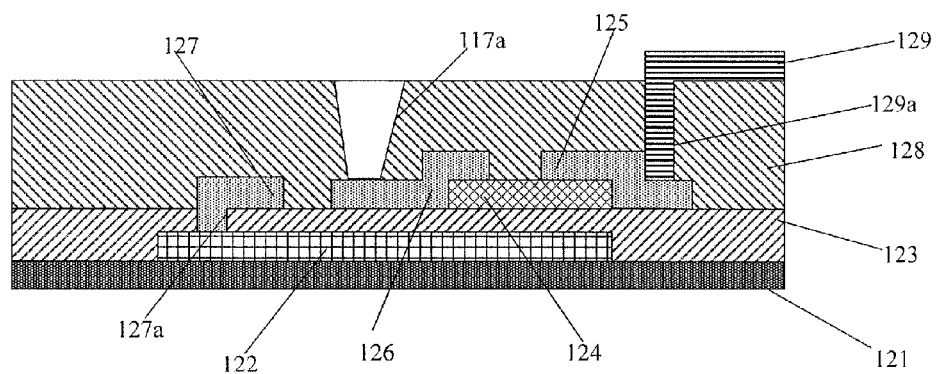

As illustrated in FIG. 5g, a pattern of the first via hole 117a may be formed in a region of the passivation layer 128 which corresponds to the drain electrode 126 through a fifth patterning process. Furthermore, a pattern of a fourth via hole 129a may further be formed through the same fifth patterning process in a region of the passivation layer 128 which corresponds to the source electrode 125, and a pattern of a pixel electrode 129 is formed on the passivation layer 128 through a six patterning process. The detailed processes will not be elaborated here. The array substrate is obtained after the step 570 is finished.

580: assembling the color filter substrate and the array substrate to form a cell, wherein a first end of the conductive spacer 117 is connected to the drain electrode 126 by way of the first via hole 117a, and the gate connection line 127 is disposed parallel to the data line 112.

Figure 5H:
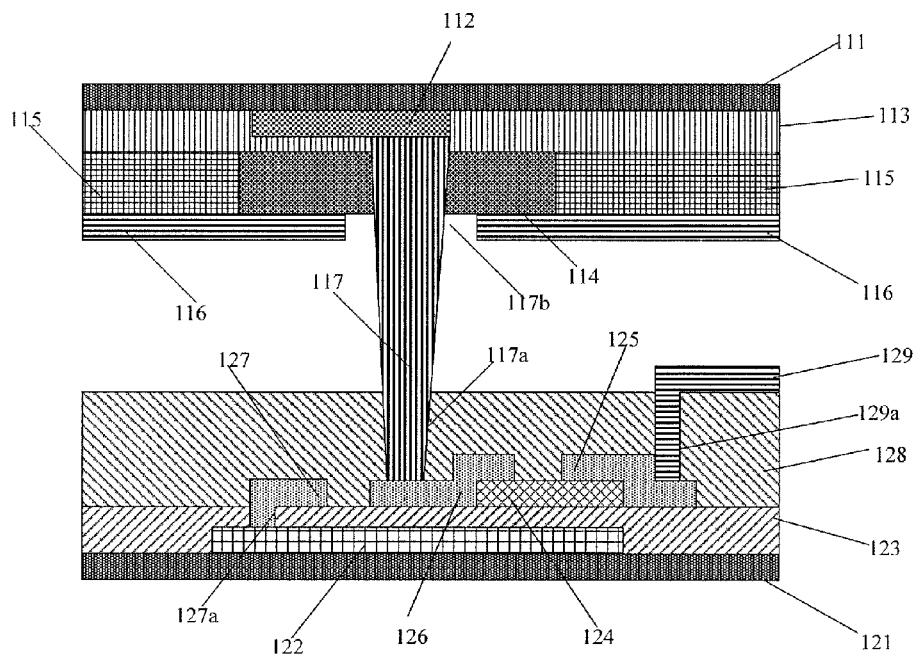

As illustrated in FIG. 5h, after assembling the color filter substrate and the array substrate, the conductive spacer 117 is electrically connected with both the data line 112 and the drain electrode 126, thus, a data signal is transformed from the color filter substrate to the drain electrode 126 on the array substrate. In the embodiment, positions of the source electrode 125 and the drain electrode 126 may be exchanged as required by practical applications.

In the method of the embodiment, eight patterning processes are required for the array substrate and six patterning processes for the color filter substrate. The display panel of Embodiment 1 may be fabricated with totally 14 patterning processes. Thus, the process procedure is simple, and the frame width of the fabricated display panel is reduced while the display effect is improved.

Embodiment 4

The method for fabricating a display panel of the embodiment is substantially the same as that of Embodiment 3, with the difference in that, as shown in FIGS. 6a~6d, the fabrication procedure of the array substrate in the embodiment is as follows:

610: sequentially forming patterns of a gate line 122, a gate insulating layer 123 and an active layer 124 on a second substrate 121.

Figure 6A:
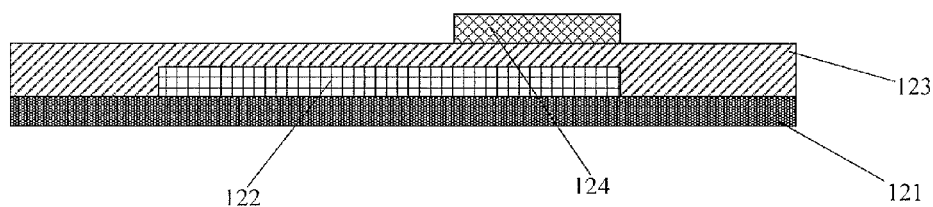
FIGS. 6a~6d schematically illustrates respective process steps of a method for fabricating a display panel in accordance with Embodiment 4 of the invention.

As illustrated in FIG. 6a, patterns of the gate line 122 and the active layer 124 may be formed by using a known technology, such as through two patterning processes. The detail process procedure will not be elaborated here.

620: forming a pattern of a source electrode 125 and a drain electrode 126 on the active layer 124, forming a pattern of a gate connection line 127 on a region of the gate insulating layer 123 which corresponds to the gate line 122; the gate connection line 127 is perpendicular to the gate line 122.

Figure 6B:
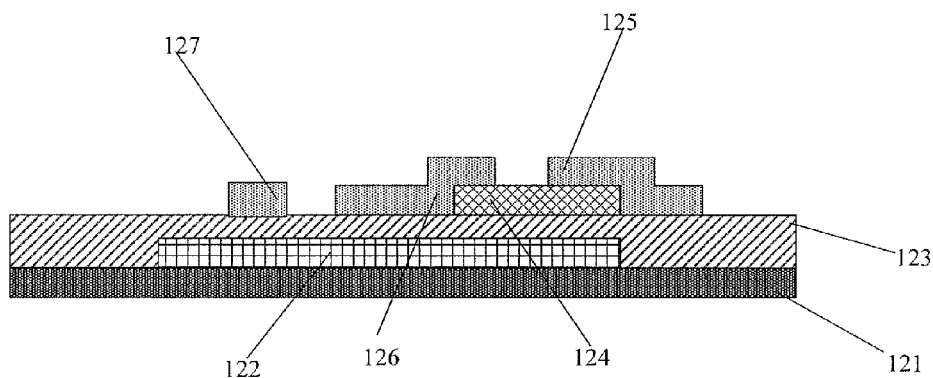

As illustrated in FIG. 6b, in step 620, while the pattern of the source electrode 125 and the drain electrode 126 is formed, the pattern of the gate connection line is further formed on the gate insulating layer 123 through a same and one patterning process.

630: forming a passivation layer 128 on the source electrode 125, the drain electrode 126 and the gate connection line 127, forming a pattern of a first via hole 117a in a region of the passivation layer 28 which corresponds to the drain electrode 126, forming a pattern of a third via hole 127a' in a region of the passivation layer 128 and the gate insulating layer 123 which corresponds to the gate line 122.

Figure 6C:
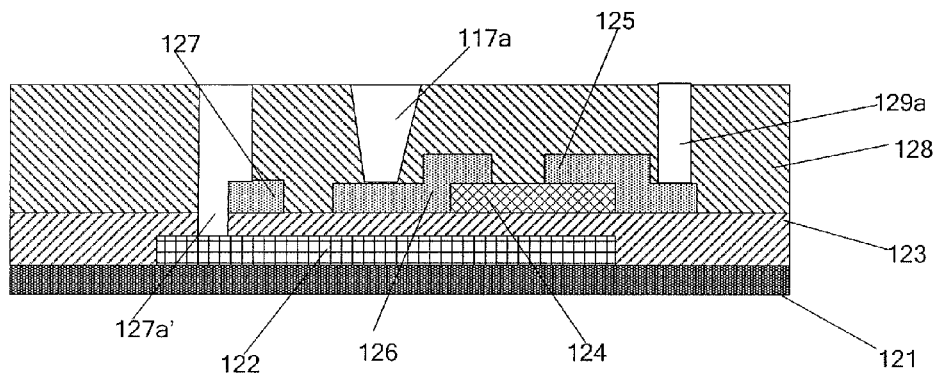
Figure 6D:
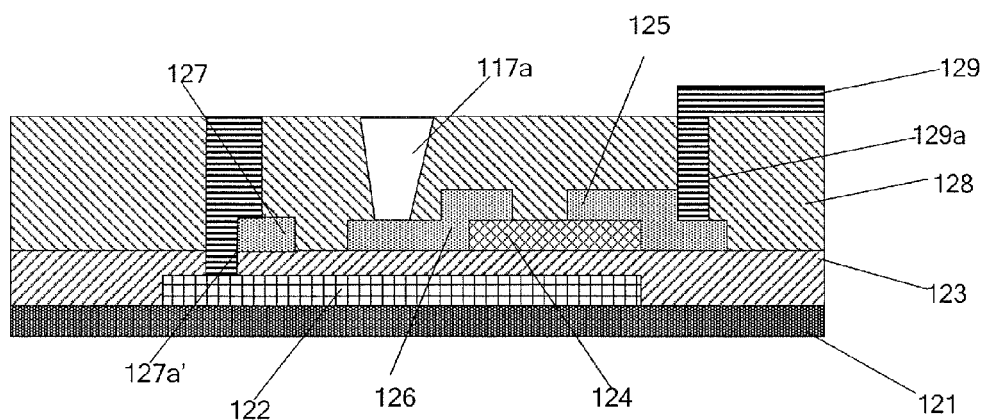

As illustrated in FIG. 6c, in step 630, a single patterning process is used to simultaneously form patterns of the first via hole 117a, the third via hole 127a and the fourth via hole 129a. The fourth via hole 129a is formed in a region of the passivation layer 128 which corresponds to the source electrode 125.

640: forming a pattern of a pixel electrode 129 on the passivation layer 128, filling the third via hole 127a' with a metal material same as the material of the pixel electrode 129 to connect the gate line 122 and the gate connection line 127.

The procedure for forming the pixel electrode 129 in step 640 is substantially same as a known procedure, such as by using a single patterning process, with the difference in that the third via hole 127a' is further filled with the same metal material as the material of the pixel electrode 129.

In the embodiment, the fabrication of the array substrate involves five patterning processes. Therefore, in the embodiment, the fabrication of the display panel involves totally thirteen patterning processes. In comparison with Embodiment 3, it further reduces the number of the patterning processes, thereby simplifying the process procedure and reducing the fabrication cost.

Embodiment 5

The embodiment of the invention further provides a display device; the display device comprises the display panel of any one of the above embodiments. The display device may be a liquid crystal panel, an E-paper, an OLED panel, a plasma panel, a liquid crystal television, a LCD, a digital photo-frame, a mobile phone, a tablet PC and any product or component having a display function.

In the display panel, the method for fabricating the same and the display device described in the above embodiments of the invention, the gate connection line is disposed in the display region, thereby reducing the width of the frame. Meanwhile, the data line is disposed on the color filter substrate and the data line is connected to the drain electrode of the array substrate by way of the conductive spacer, thereby increasing the distance between the data line and the gate connection line, thus the cross-talk between the data line and the gate connection line is reduced. As a result, the width of the frame is reduced while the display effect of the display panel and the display device is improved.

What are described above is related to the illustrative embodiments of the disclosure only and not limitative to the scope of the disclosure; the scopes of the disclosure are defined by the accompanying claims.

What is claimed is:

1. A display panel, comprising an array substrate and a color filter substrate, wherein
a gate line and a gate connection line of the array substrate are disposed perpendicular to each other;
a passivation layer is formed on a side of a source electrode or a drain electrode of the array substrate which is close to the color filter substrate, a first via hole is disposed in a region of the passivation layer which corresponds to the source electrode or the drain electrode;
the color filter substrate comprises a first substrate; a data line parallel to the gate connection line is formed on a side of the first substrate which is close to the array substrate; a protection layer, a black matrix and a common electrode are sequentially formed on a side of the data line which is close to the array substrate; a second via hole is disposed in a region of the protection layer, the black matrix and the common electrode which corresponds to the data line; a conductive spacer is disposed in the second via hole, a first end of the conductive spacer is connected to the source electrode or the drain electrode by way of the first via hole, a second end of the conductive spacer is connected to the data line by way of the second via hole, and the conductive spacer is insulated from the common electrode.

2. The display panel of claim 1, wherein the gate line is formed on a side of a second substrate of the array substrate which is close to the color filter substrate; a gate insulating layer is formed on a side of the gate line which is close to the color filter substrate; the gate connection line, the source electrode and the drain electrode are formed on a side of the gate insulating layer which is close to the color filter substrate;
  a third via hole is formed in the gate insulating layer, the gate connection line is connected to the gate line by way of the third via hole.

3. The display panel of claim 1, wherein the gate connection line is formed in a projection region of the black matrix on the second substrate, and the data line is formed in a projection region of the black matrix on the first substrate.

4. The display panel of claim 1, wherein a color filter of the color filter substrate is disposed in the same layer as the black matrix, and the third via hole further penetrates through the color filter.

5. The display panel of claim 1, wherein a protrusion is formed on the data line, a position of the protrusion corresponds to that of the source electrode or the drain electrode, and the protrusion is connected to the second end of the conductive spacer.

6. The display panel of claim 1, wherein a material of the gate connection line is same as that of the source electrode or the drain electrode.

7. The display panel of claim 1, wherein an opening of the second via hole in the common electrode is enlarged to prevent the conductive spacer in the second via hole from contacting the common electrode.

8. A display device comprising the display panel of claim 1.

9. A method for fabricating a display panel, comprising steps of:
  forming a pattern of a data line on a first substrate;
  forming a protection layer on the data line, and forming a pattern of a second sub-via hole in a region of the protection layer which corresponding to the data line;
  sequentially forming patterns of a black matrix and a common electrode on the protection layer, and forming a pattern of a second via hole in the black matrix and the common electrode at a location corresponding to the second sub-via hole;
  forming a pattern of a conductive spacer in the second via hole, wherein a second end of the conductive spacer is connected to the data line by way of the second via hole, and the conductive spacer and the common electrode are disposed as insulating from each other, thereby forming a color filter substrate;
  forming an array substrate, wherein a gate electrode and a gate connection line of the array substrate are disposed orthogonal to each other, a first via hole is formed in a passivation layer of the array substrate in a region corresponding to the source electrode or the drain electrode;
  assembling the color filter substrate and the array substrate to form a cell, wherein a first end of the conductive spacer is connected to the source electrode or the drain electrode by way of the first via hole, and the gate connection line is disposed parallel to the data line.

10. The method of claim 9, wherein the step of forming the array substrate comprises:
  sequentially forming patterns of a gate line and a gate insulating layer on a second substrate, and forming a pattern of a third via hole in a region of the gate insulating layer which corresponds to the gate line;
  sequentially forming patterns of an active layer, a source electrode and a drain electrode on the gate insulating layer, and forming a pattern of a gate connection line on the gate insulating layer, wherein the gate connection line is connected to the gate line by way of the third via hole, and the gate connection line is perpendicular to the gate line;
  forming a passivation layer on the source electrode, the drain electrode and the gate connection line, and forming a pattern of a first via hole in a region of the passivation layer which corresponds to the source electrode or the drain electrode.

11. The method of claim 9, wherein the step of forming the array substrate comprises:
  sequentially forming patterns of a gate line, a gate insulating layer and an active layer on a second substrate;
  forming a pattern of a source electrode and a drain electrode on the active layer, and forming a pattern of a gate connection line on a region of the gate insulating layer which corresponds to the gate line, wherein the gate connection line is perpendicular to the gate line;
  forming a passivation layer on the source electrode, the drain electrode and the gate connection line, forming a pattern of a first via hole in a region of the passivation layer which corresponds to the source electrode or the drain electrode, and forming a pattern of a third via hole in a region of the passivation layer and the gate insulating layer which corresponds to the gate line;
  forming a pattern of a pixel electrode on the passivation layer, and filling the third via hole with a metal material same as that of the pixel electrode to connect the gate line and the gate connection line.

12. The method of claim 9, wherein a pattern of a color filter disposed in the same layer as the black matrix is further formed on the protection layer during the formation of the color filter substrate, the second via hole further penetrates through the color filter.

13. The method of claim 9, wherein a protrusion is formed on the data line, a position of the protrusion corresponds to that of the source electrode or the drain electrode, and the protrusion is connected to a second end of the conductive spacer.

14. The method of claim 9, wherein a material of the gate connection line is same as that of the source electrode or the drain electrode.

15. The method of claim 9, wherein an opening of the second via hole in the common electrode is enlarged to prevent the conductive spacer in the second via hole from contacting the common electrode.

16. The display panel of claim 2, wherein a color filter of the color filter substrate is disposed in the same layer as the black matrix, and the third via hole further penetrates through the color filter.

17. The display panel of claim 3, wherein a color filter of the color filter substrate is disposed in the same layer as the black matrix, and the third via hole further penetrates through the color filter.

18. The display panel of claim 2, wherein a protrusion is formed on the data line, a position of the protrusion corresponds to that of the source electrode or the drain electrode, and the protrusion is connected to the second end of the conductive spacer.

19. The display panel of claim 3, wherein a protrusion is formed on the data line, a position of the protrusion corresponds to that of the source electrode or the drain electrode, and the protrusion is connected to the second end of the conductive spacer.

20. The display panel of claim 4, wherein a protrusion is formed on the data line, a position of the protrusion corresponds to that of the source electrode or the drain electrode, and the protrusion is connected to the second end of the conductive spacer.

* * * * *